United States Patent [19]

Hirano et al.

[11] 4,022,652
[45] May 10, 1977

[54] METHOD OF GROWING MULTIPLE MONOCRYSTALLINE LAYERS

[75] Inventors: Hitoshi Hirano, Kanagawa; Tsuguo Fukuda, Yokohama, both of Japan

[73] Assignee: Tokyo Shibaura Electric Co., Ltd., Kawasaki, Japan

[22] Filed: Sept. 9, 1975

[21] Appl. No.: 611,838

[30] Foreign Application Priority Data

Sept. 26, 1974 Japan .................... 49-110026

[52] U.S. Cl. ................. 156/605; 156/608; 156/617 SP; 156/DIG. 87; 148/172; 148/171; 29/576 E; 427/82

[51] Int. Cl.² ............... B01J 17/18; B01J 17/34; B01J 17/36; C01G 35/00

[58] Field of Search ........... 156/617 SP, DIG. 71, 156/608, 605, 622, DIG. 87, DIG. 64, DIG. 61; 23/273 SP, 305 RE, 302 R; 148/171, 172; 29/569, 570, 576; 427/82, 86, 88, 89, 90

[56] References Cited

UNITED STATES PATENTS

| | | | |
|---|---|---|---|
| 2,809,135 | 10/1957 | Roury | 148/172 X |
| 2,992,517 | 7/1961 | Hicks | 156/608 |
| 3,470,039 | 9/1969 | Goundry | 156/608 |
| 3,591,348 | 7/1971 | La Belle | 156/608 |
| 3,649,351 | 3/1972 | Grabmaier | 156/617 SP |
| 3,755,011 | 8/1973 | Kleinknecht | 156/608 |

FOREIGN PATENTS OR APPLICATIONS

| | | | |
|---|---|---|---|
| 85,983 | 6/1971 | Germany | 156/DIG. 71 |
| 412,816 | 11/1966 | Switzerland | 148/172 |
| 826,800 | 1/1960 | United Kingdom | 148/172 |

OTHER PUBLICATIONS

LaBelle, Mat. Res. Bull., vol. 6, No. 7, pp. 581 to 590, (1971).
Miyazawa, Appl. Phys. Lett., vol. 23, No. 4, Aug. 1973, pp. 198 to 200.
Iivasaki, Rev. of the Elec. Commu. Lab., vol. 20, No. 1–2, Jan.–Feb. 1972, pp. 129 to 137.

*Primary Examiner*—Stephen J. Emery
*Attorney, Agent, or Firm*—Cushman, Darby & Cushman

[57] ABSTRACT

A method of growing multiple monocrystalline layers from melts comprising growing a first monocrystalline layer from the first melt, and growing a second monocrystalline layer on the first monocrystalline layer from the second melt by successively contacting the first monocrystalline layer with the second melt during the growth of the first monocrystalline layer.

12 Claims, 6 Drawing Figures

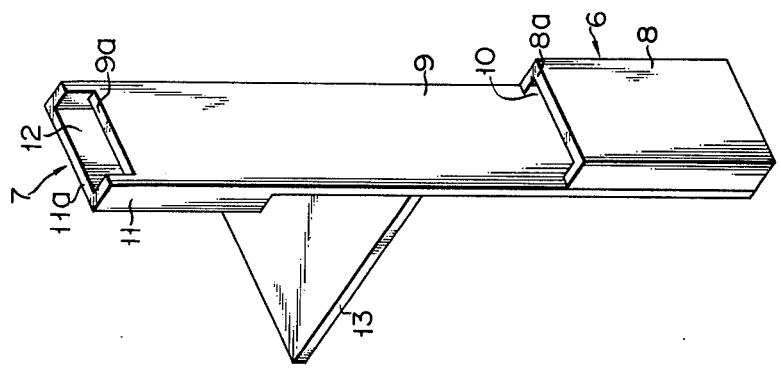
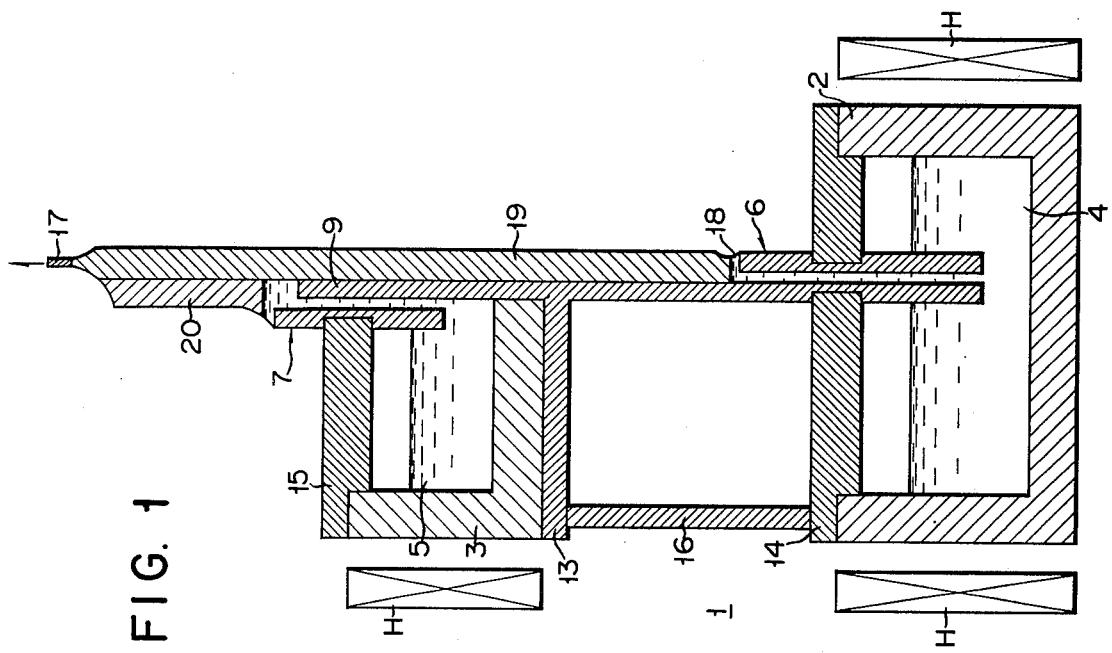

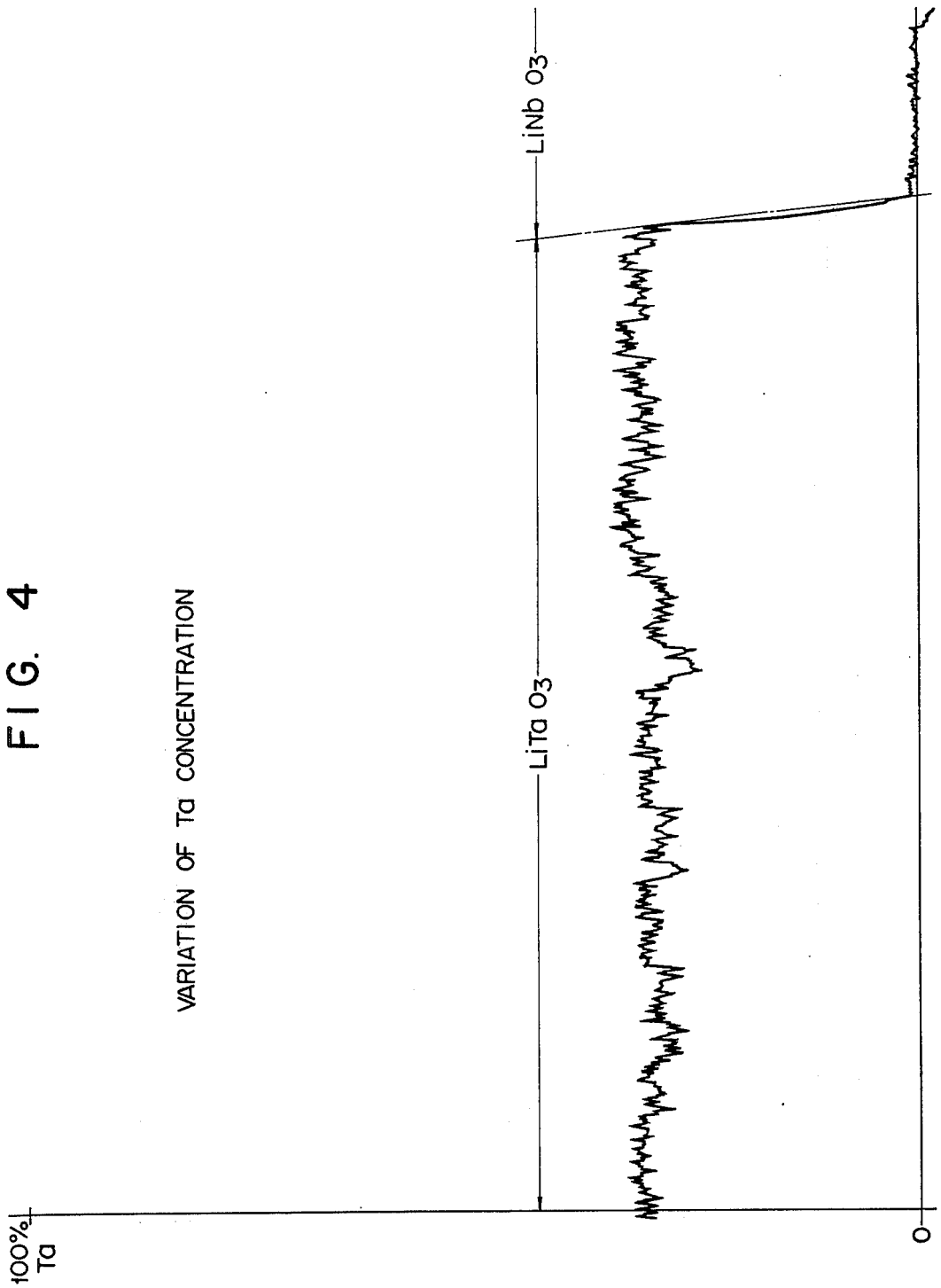

METHOD OF GROWING MULTIPLE MONOCRYSTALLINE LAYERS

BACKGROUND OF THE INVENTION

I. Field of the Invention

This invention relates to a method of growing crystals from melts, and more particularly to a method of growing multiple monocrystalline layers.

II. Description of Prior Art

A multi-layer structural semiconductor element wherein a semiconductor monocrystalline layer is formed on a monocrystalline insulating substrate, such as SOS (silicon on sapphire) is widely applied to a semiconductor device such as a MOS transistor or a junction transistor. Further, a semiconductor element consisting of multiple monocrystalline layers of different semiconductor materials is also applied to various devices such as, for example, a surface wave device utilizing the respective characteristics of the semiconductor materials constituting the monocrystalline layers.

A prior art method for producing such layers comprises growing on a monocrystalline substrate previously prepared by a well known technique such as Czochralski method a desired monocrystalline layer using a crystal growth method including a gas-phase or liquid-phase growth method, or a melt growth method. For example, U.S. Pat. 3,650,822 discloses a method for producing multiple monocrystalline layers by a melt growth which comprises immersing an electrically insulating substrate body in an appropriate semiconductor melt and slowly pulling the substrate body from the melt at a rate of 50 to 100 mm/hr to permit the semiconductor to be epitaxially grown on the surface of the substrate body. This method can produce such multiple layers as the aforesaid SOS.

The above-mentioned prior art method necessitates two independent operations — an operation for obtaining a monocrystal constituting a substrate and an operation for further growing a monocrystal on the substrate thus obtained, and its overall process is troublesome and its mass-productivity is low. Further, the prior art method would impose a limitation upon the substrate size, and the size of a multi-layer structural semiconductor element as finally obtained, accordingly, is limited to that of the substrate. Further, in such a method as disclosed in the above U.S. Pat. No. 3,650,822, the substrate, particularly a portion of the substrate at the side of the melt stays in the melt for a relatively long time, and therefore the heat of the melt remains in the substrate for a relatively long time even after the substrate is withdrawn from the melt. As a result, the mutual diffusion of atoms from either of the substrate or the crystalline layer into the other takes place, rendering the boundary between layers unclear.

SUMMARY OF THE INVENTION

An object of the invention is to provide a method of successively growing multiple monocrystalline layers from melts.

Another object of the invention is to provide a method of growing multiple monocrystalline layers the boundaries between which are each made clear and the junctions between which are each extremely good.

A further object of the inventon is to provide a method of growing multiple monocrystalline layers which is capable of growing the multiple monocrystalline layers without substantially imposing a limitation upon their size.

These and other objects which will be apparent from the following detailed description are attained by a method of successively growing multiple monocrystalline layers comprising contacting a seed with a first melt; slowly withdrawing said seed from said first melt by relative movement between said seed and said first melt, to permit growth of a first monocrystalline layer comprised of a cooled zone and an uncooled zone on said seed; and sequentially contacting with a second melt the cooled zone of said first monocrystalline layer successively grown by successively performing the seed withdrawal, to permit a successive growth of a second monocrystalline layer comprised of a cooled zone and an uncooled zone on said first monocrystalline layer.

The melt employed in carrying out the present method may consist simply of raw materials of monocrystals to be grown, or may further contain an n type impurity of a p type impurity or a flux.

A first monocrystalline layer is grown from the melt through contacting a seed with the melt. This growth is effected by pulling the seed from the melt, or by pulling down the melt with the seed fixed, or by laterally moving the seed or melt without limiting to a vertically moving operation such as said pulling or pulling-down operation. That is to say, said growth is effected by withdrawing the seed from the melt through relative movement between the seed and the melt. One of the essential features of the invention resides in that a first growing monocrystalline layer becomes a substrate for a second monocrystalline layer. By sequentially contacting with a second melt a cooled zone of the first monocrystalline layer as later described in detail, the second monocrystalline layer is successively formed on the first monocrystalline layer. When this is viewed from the aspect of the seed movement, it results that multiple monocrystalline layers are obtained only through one stage-movement of the seed. Accordingly, an overall process becomes extremely simple.

According to the invention, multiple monocrystalline layers of different insulating materials, of different semiconductor materials, or of an insulating material and a semiconductor material can be obtained.

BRIEF DESCRIPTION OF THE DRAWING

This invention will be more fully understood from the following detailed description when taken in connection with reference to the accompanying drawings, in which:

FIG. 1 is a sectional view of an apparatus used to grow double monocrystalline layers by the method of the invention;

FIG. 1A is a perspective view showing part of the device shown in FIG. 1;

FIG. 4 shows diffusion of atom in the multiple monocrystalline layers obtained according to the invention.

DETAILED DESCRIPTION OF THE PREFERRED EMBODIMENTS

Figure 3:
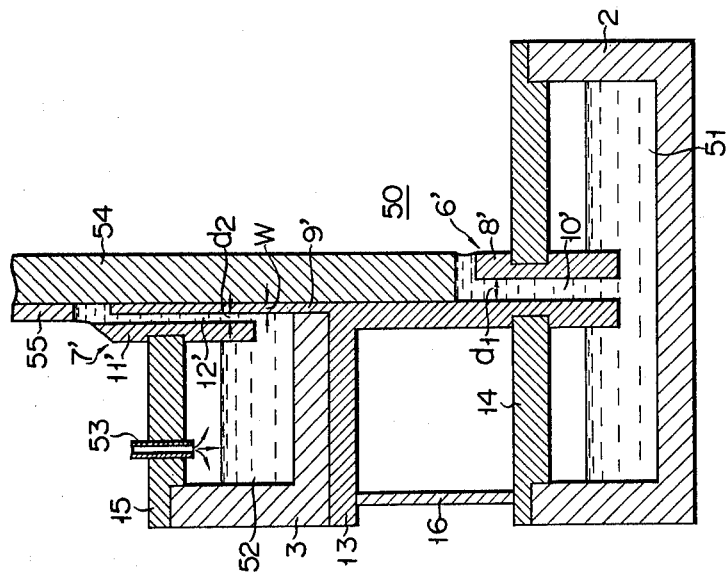
FIG. 3 is a sectional view of a modification of the apparatus shown in FIG. 1.

This invention will now be described with reference to the appended drawings. Throughout the following examples, the first monocrystalline layer growth is effected by pulling a seed using capillary method. Although a monocrystal is used as the seed throughout the following example, a polycrystalline, an amorphous, or a pure metallic seed can also be used. Though a polycrystalline crystal is initially grown on the polycrystalline, amorphous, or pure metallic seed, no inconvenience occurs since a monocrystalline crystal is obtained in time by successively performing the pulling operation. Further, throughout the following examples, the multiple monocrystalline layer growth is effected by batch system. The present inventors have found, however, that a continuous supply system can also be adopted by supplying raw material of an object monocrystal to each of melts in a molten state, or spraying, in case of a Si melt, a mixed gas of silicon tetrachloride and chlorine to this Si melt. Such supply of the raw material to the melt would prevent to occurrence of undesirable phenomena such as the temperature variation within the melt, the distortion of monocrystal obtained, or the crystal growth on the supplied raw material which occur due to the direct supply of the raw material. Such continuous supply system can provide a multiple monocrystalline layer structure which is not substantially limited in respect of its size. Further, capillaries of the invention are not also limited to those used in the following examples but may be constructed between two flat plates disposed opposite to each other or constructed into a cylindrical configuration.

First, the process of growing double monocrystalline layers of lithium tantalate and lithium niobate in accordance with the present method is hereinafter explained referring to FIGS. 1 and 1A. In FIG. 1, there is shown an apparatus 1 used to practise this method. The apparatus 1 has an iridium crucible 2 and a platinum crucible 3 disposed vertically. The lower crucible 2 is charged with a melt 4 from which a lithium tantalate monocrystal is to be grown and which comprises lithium carbonate and tantalum pentoxide in a molar ratio of 1 : 1. The upper crucible 3 is charged with a melt 5 from which a lithium niobate monocrystal is to be grown and which comprises lithium carbonate and niobium pentoxide in a molar ratio of 1 : 1. Around the crucibles 2 and 3 are provided heaters H, H by which the raw materials in the crucibles 2 and 3 are heated above their respective melting points and thus kept in a molten state. The temperature of the melt 4 is held at 1650° C to 1700° C, preferably 1680° C, while the temperature of the melt 5 is held at 1230° C to 1280° C, preferably 1250° C. Preferably, the respective melts in the crucibles 2 and 3 are kept in a state wherein the melt temperature is gradually decreased from below to above.

In the crucibles 2 and 3 there are disposed, respectively, liquid column-forming members 6 and 7 made of iridium, which can act to regulate the respective configurations of crystals to be grown from the melts 4 and 5. As best shown in FIG. 1A, the member 6 is comprised of a channel-shaped elongate frame unit 8 and a longitudinally disposed flat plate 9, between which is formed a space 10 constituting a capillary. The upper end of the frame unit 8 has a flat face 8a. The lower end portion of the member 6 is introduced into the melt 4, which rises through the space 10 up to substantially the same level as the face 8a due to the capillary action. The member 7 is comprised of the flat plate 9 and a frame unit 11 having the same configuration as the frame unit 11, between which is formed a space 12 similar to the space 10. The upper end of the frame unit 11 has a flat face 11a and the upper end of the flat plate 9 has a flat face 9a. The upper end face 9a of the flat plate 9 is situated in a position lower than the upper end face 11a of the frame unit 11. The lower end portion of the frame unit 11 is introduced into the melt 5 while the upper portion of the flat plate 9 constitutes one wall of the crucible 3. The melt 5 rises through the space 12 up to substantially the same level as the face 9a due to the capillary action to permit a liquid column to be formed in the space 12. The flat plate 9 has on its halfway point a support plate 13 for supporting the crucible 3, which is put on this support plate 13.

Preferably, coverings 14 and 15 are provided, respectively, on the upper open ends of the crucibles 2 and 3 in such a manner as not to completely close said open end, so that entry of impurities into the melts 4 and 5 from the open air may be prevented as much as possible. Further, a support rod 16 is provided between the support plate 13 and the covering 14 in order to stably support the support plate 13.

As will be understood from the foregoing description, the spaces 10 and 12 function as the capillaries to permit the liquid columns to be formed therein. The distance between the flat plate 9 and the frame unit 8 or 11, accordingly, can be properly determined in consideration of the surface tension of the melt 4 or 5. Such determination would be readily made by those skilled in the art. For example, in the apparatus 1, the respective thickness of the flat plate 9 and the frame units 8, 11 have only to be made 0.1 to 1 mm, or preferably 0.4 mm, the distance between the flat plate 9 and the frame unit 8 or 11 has only to be made 0.01 to 1 mm, or preferably 0.2 mm, and the distance between the respective skirt portions of each of the frame units 8, 11 has only to be made 5 to 40 mm, or preferably 15 mm.

Hereinafter is explained the method of growing a twolayer structural monocrystal consisting of a lithium tantalate (LiTaO$_3$)-monocrystalline layer and a lithium niobate (LiNbO$_3$)-monocrystalline layer using the apparatus 1.

First, a LiTaO$_3$ seed monocrystal 17 is allowed to contact the upper surface of a liquid column of the melt 4 having risen within the space 10 up to the level of the face 8a of the frame unit 8 due to the capillary action, and is for a while kept in said condition. Then, the seed monocrystal 17 is slowly pulled (at a rate of, for example, 1 mm/min.) by means of an appropriate pulling mechanism (not shown). By so doing, the face 8a of the frame unit 8 is wetted with the melt 4 due to the surface tension thereof. Thus, a pool 18 of the melt 4 is formed at the face 8a, and at this pool 18 a LiTaO$_3$ monocrystal is grown on the seed crystal 17. By successively pulling the seed crystal 17 a LiTaO$_3$ monocrystalline layer 19 whose cross section is of the same configuration as the upper face 8a of the frame unit 8 is successively grown along the flat plate 9. The flat plate 9 serves as a guide for the monocrystalline layer 19. Respective amounts of said liquid column and said pool 18 consumed due to the growth of said LiTaO$_3$ monocrystal are compensated from the melt 4 in the crucible 2 owing to the capillary action of the space 10. A portion or zone of the monocrystalline layer 19 in the neighbourhood of the pool 18 of the melt 4 is maintained at a temperature near to that of the melt 4, and this zone is referred to as "uncooled zone" here in this specification and claims. In the monocrystalline layer 19, the layer temperature is gradually decreased toward the top zone, that is, the upper zone is lower in temperature than the melt 4. This zone is referred to as "cooled zone" here in this specification and claims. The boundary between the uncooled zone and the cooled zone is not so critical. When viewing from the device 1, it will be apparent that the position of the uncooled zone is substantially fixed.

When the $LiTaO_3$ monocrystalline layer 19 continues to grow and its side face (of the cooled zone) exceeds the upper face 9a of the flat plate 9 to close the side opening portion of the frame unit 11, a new capillary is formed between the side face of the monocrystalline layer and the frame unit 11, and the melt 5 having risen through the space 12 up to the same level as the face 9a of the flat plate 9 further rises through this new capillary to wet the upper face 11a of the frame unit 11, and a $LiNbO_3$ monocrystal is grown on the $LiTaO_3$ monocrystalline layer through solidification of the melt 5 by being cooled to some extent. By successively pulling the seed crystal 17 (i.e., the growth of the $LiTaO_3$ monocrystalline layer) and cooled zone of the $LiTaO_3$ monocrystalline layer 19 is sequentially allowed to contact the melt 5, and thus a $LiNbO_3$ monocrystalline layer 20 is successively grown on the $LiTaO_3$ monocrystalline layer 19. The $LiNbO_3$ monocrystalline layer 20 is also comprised of an uncooled zone and a cooled zone. In the above-mentioned manner, there is obtained a two-layer structural monocrystal consisting of the $LiNbO_3$ monocrystalline layer and the $LiTaO_3$ monocrystalline layer.

Figure 2:
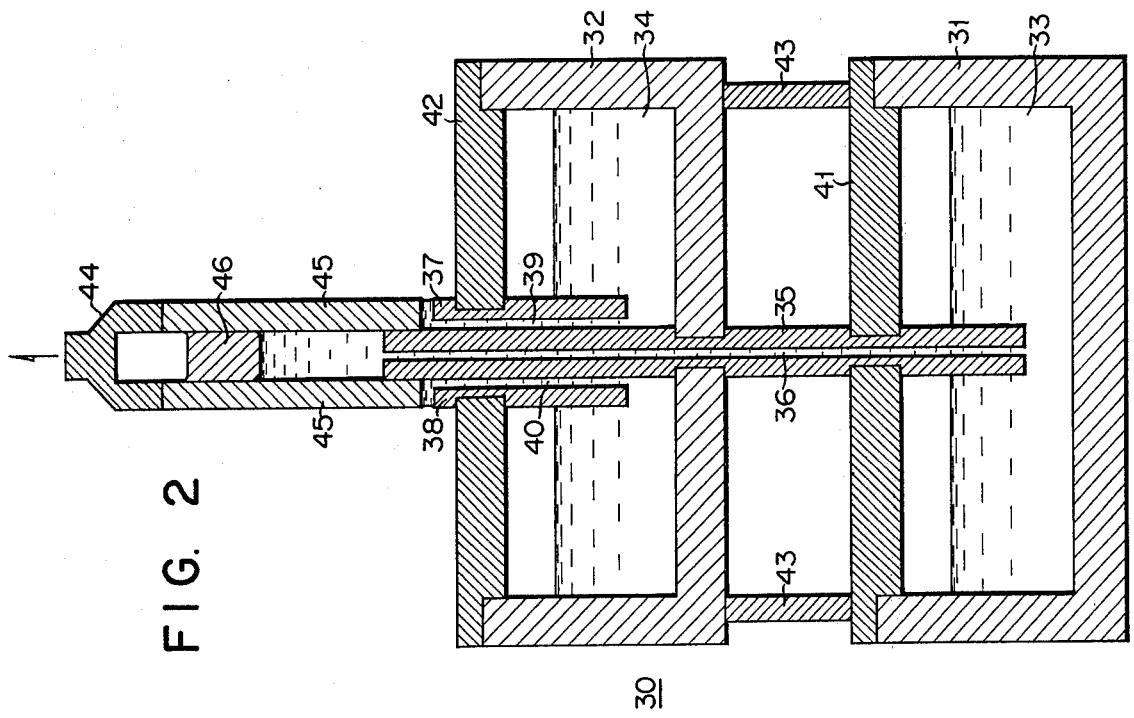
FIG. 2 is a sectional view of an apparatus used to grow triple monocrystalline layers by the method of the invention.

FIG. 2 shows an apparatus 30 structurally similar to the device 1, used to produce triple monocrystalline layers of $LiTaO_3$, $LiNbO_3$ and $LiTaO_3$ in accordance with the present method. The apparatus 30 is provided with a platinum crucible 31 and an iridium crucible 32 of the same size as the crucible 31 which have respectively heaters (not shown) around them, in such a manner that the crucibles 31, 32 are vertically disposed. The lower crucible 31 and the upper crucible 32 are charged respectively with a melt 33 having the same composition as said melt 5 and with a melt 34 having the same composition as said melt 4, which are kept at 1650° to 1700° C, or preferably 1680° C and at 1230° to 1280° C, or preferably 1250° C, respectively.

Into the melt 33 is introduced a rod 35 formed interiorly with a rectangular open slot 36 functioning as a capillary, said rod 35 penetrating through the bottom of the crucible 32 to project from the upper end of the crucible 32. In the melt 34 there are provided capillaries 39, 40 formed by the rod 35 and frame units 37, 38 of the same configuration as said frame unit 8 or 11. The upper end of the rod 35 is situated at a position higher than the upper ends of the frame units 37, 38 which are positioned at the same level.

Coverings 41 and 42 are provided on the upper open ends of the crucibles 31 and 32, respectively. Between the crucibles 31 and 32 are provided support rods 43, 43, by which the crucible 32 is supported. The melt 34 is rendered integral within the crucible 32.

In order to produce the triple monocrystalline layers of $LiTaO_3$, $LiNbO_3$ and $LiTaO_3$ by using said apparatus 30, similar operations to those in the previously mentioned example are carried out. First, a $LiTaO_3$ seed monocrystal 44 is allowed to contact the liquid column of the melt 34 having risen through the capillaries 39, 40 up to the same level as the upper end faces of the frame units 37, 38 and then is slowly pulled along the two opposite outer surfaces of the rod 35 to permit two $LiTaO_3$ monocrystalline layers 45, 45 to be successively grown at the same time. When the monocrystalline layers 45, 45 continue to grow and their cooled zones exceed the upper end of the rod 35, a new capillary is formed by those cooled zones, and the melt 33 havng risen through the capillary 36 of the rod 35 up to the upper end of the rod 35 further rises, in accordance with the surface tension of the melt 33, through this newly formed capillary increasing in size in accordance with the pulling of the sed monocrystal 44. As eill be understood from the above, the distance between the two monocrystalline layers 45, 45 is so determined as to form a capillary. As the melt 33 rises, a $LiNbO_3$ monocrystal is grown on the $LiTaO_3$ monocrystalline layerxs 45, 45 from a cooled portion of the melt 33 in a manner that said $LiNbO_3$ monocrystal is interposed between the monocrystalline layers 45 and 45. By permitting a successive growth of the $LiTaO_3$ monocrystalline layers 45, 45, their cooled zones are sequentially allowed to contact the melt 33 to cause the $LiNbO_3$ monocrystalline layer 46 to be successively grown between the monocrystalline layers 45 and 45. Thus are obtained the triple monocrystalline layers of $LiTaO_3$, $LiNbO_3$ and $LiTaO_3$.

It will be apparent to those skilled in the art that double monocrystalline layers of sapphire and Si (SOS) or of Si and Ge can be obtained by carrying out sinilar operations using such an apparatus as shown in FIG. 1. Further, any other mulitple monocrystalline layers, for example, those of sapphire, Si and Ge can be obtained by providing a monocrystal-forming section in three or more stages.

Here, attention should be paid to the fact that according to the present method a semiconductor layer formed with a pn junction, a pnp junction can be easily obtained. For example, in cases where the SOS is pulled usng the same apparatus as that shown in FIG. 1, a seed monocrystal is allowed to contract an α-alumina melt having risen through the capillary 10 from the crucible 2 up to the upper end of the frame unit 8. By pulling this seed monocrystal, a sapphire monocrystalline layer is grown thereon. Thereafter, as above described, a silicon melt is allowed to contact a cooled zone of this sapphire monocrystal. In this case, an n type (or p type) impurity is beforehand introduced into this silicon melt. In this way, an n type (or p type) Si monocrystal is grown on the sapphire monocrystalline layer and simultaneously a p type (or n type) impurity gas is allowed to contact an uncooled zoned of this Si monocrystalline layer (that is, immediately after the Si monocrystalline layer has been grown). This p type (or n type) impurity is diffused into the n type (or p type) Si monocrystal finally to obtain an SOS of the type wherein the Si monocrystalline layer formed with a pn junction is formed on the sapphire monocrystalline layer. Further, if a mixed gas of a p type impurity and an n type impurity having different diffusion coefficients is employed as an impurity gas, a pnp or npn junction can be formed correspondingly to those diffusion coefficients. Introduction of such impurity may be effected by ion implantation.

Upon producing an SOS using an apparatus which has the same construction as in FIG. 1 and whose respective members 6, 7 for regulating the configurations of crystals to be grown are of the above-mentioned dimensions, it happens that its alumina monocrystalline layer and Si monocrystalline layer have the same thickness of, for example, 600 micrometers to fail to apply this SOS directly to a semiconductor device. An SOS presently put to practical use has an alumina monocrystalline layer-thicknes of approximately 300 micrometers and a Si monocrystalline layer-thickness of approximately 10 micrometers. In order to obtain directly such dimension of SOS, an apparatus 50 shown in FIG. 3 can be conveniently used.

The apparatus 50 is one having slightly modified the liquid column-forming members 6, 7 of the device 1 shown in FIG. 1. The remaining parts and sections are the same as those of the apparatus of FIG. 1 and are denoted by the same reference numerals for convenience. The apparatus 50 is provided with a crucible 2 charged with an α-alumina melt 51 and a crucible 3 charged with a silicon melt 52 in a manner that those crucibles are vertically disposed, and coverings 14 and 15 are provided on the crucibles 2 and 3, respectively. The crucible 3 is put on a support plate 13, which is supported by a support rod 16.

A liquid column-forming member 6' is of the same configuration as the member 6 of the apparatus 1 of FIG. 1, but the thickness of a frame unit 8' is made approximately 150 micrometers and the distance d2 between a flat plate 9' and the frame unit 8' is made 150 micrometers. A space 10' is constituted by the frame unit 8' and the flat plate 9'. The thickness W of a portion of the flat plate 9' constituting one wall of the crucible 3 is made approximately 5 micrometers. The frame unit 11' constituting part of a liquid column-forming member 7' has its upper end chamfered, that is, this upper end is not formed into a flat surface 11a as in said frame unit 11. In this case, the cross sectional configuration of a Si monocrystalline layer being obtained is regulating only by the configuration of a space 12' regardless of the configuration of the frame unit 11'. The distance d2 between the frame unit 11' and the flat plate 9' is made approximately 2 to 3 micrometers. Since the distance between the frame unit 11' and the flat plate 9' is made narrow as above described, the rising of a melt 52 through the space 12' formed therebetween is rendered difficult. To cover this inconvenience, an inert gasintroducing means 53 penetrating through the covering 15 to reach a space portion of the crucible 3 above the surface of the melt 3 is provided. An inert gas such as argon is introduced from this introducing means into the crucible 3 to oppress the surface of the melt 52 thereby to permit the melt 52 to rise through the space 12' up to the upper end thereof. Thus is formed a liquid column of the melt 52, and a portion of this liquid column consumed due to the crystal growth is compensated. The crucible 3 is airtightly covered with the covering 15. By performing similar operations to those in the preceding examples using the apparatus of the above-mentioned construction, there is obtained an SOS wherein a silicon monocrystalline layer 55 approximately 10 micrometers thick is grown on a sapphire monocrystalline layer 54 approximately 10 micrometers thick, Note here that it is possible to use the SOS thus obtained as the one for use in LSI (Large Scale Integrated Circuit) by etching the Si monocrystalline layer thereof to make its thickness extremely small, for example, approximately 1 micrometer.

The above-mentioned method of permitting the melt to rise through the space 12' by applying an external pressure to the melt surface is not limited to the case where the distance between the frame unit 11' and the flat platte 9' is small, but can be applied also to the method as described by reference to FIGS. 1 and 2.

Figure 5:
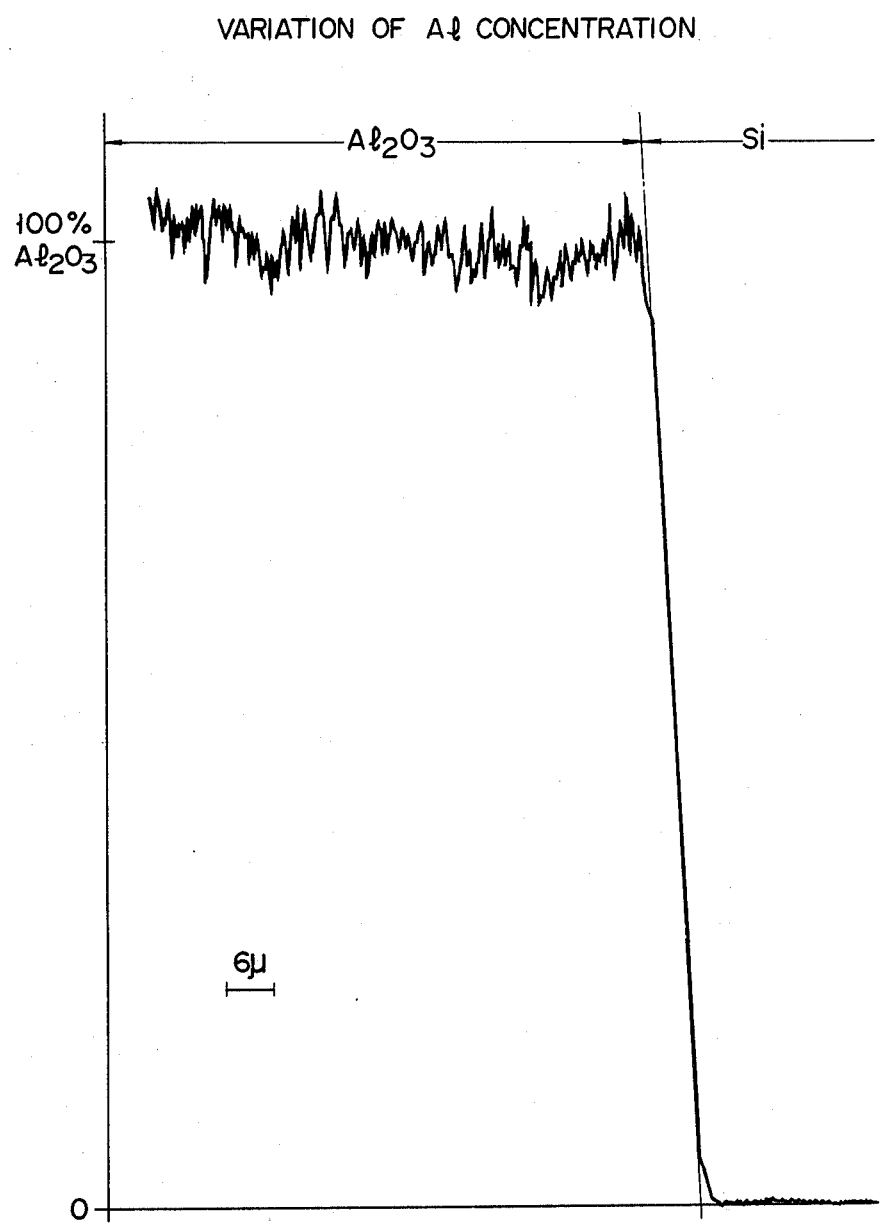
FIG. 5 shows diffusion of atom in another multiple monocrystalline layers obtained according to the invention.

With respect to multi-layer structural monocrystals obtained by the method of the invention, such as a two-layer monocrystal of $LiNbO_3/LiTaO_3$ and a two-layer monocrystal of $Si/Al_2O_3$, the Ta concentration of the former monocrystal and the Al concentration of the latter monocrystal were measured. In both cases extremely sharp concentration variations were found to occur at the boundaries between layers as shown in FIG. 4 and FIG. 5, respectively, that is to say, the mutual diffusion of atoms constituting each of the two layers litle takes place. Further, it has been found that where, for example, an SOS whose Si monocrystalline layer has as small a thickness as 1 micrometer, such mutual diffusions of atoms do not take place. The photography-observation reveals that each monocrystalline layer has no defects such as cracks and the junction between layers partly because a period during which the first monocrystal as constituting a substrate is kept in contact with the second melt for the second monocrystal is very short and partly because simultaneously with a contact of the second melt with the first monocrystal this contacted portion of the second melt is withdrawn from the second melt, so that a period during which the first monocrystal and the second melt are kept in contact at high temperature is also short.

What we claim is:

1. A method of growing multiple monocrystalline layers from melts, comprising:
    A. contacting a seed with a first melt in a first crucible;
    B. Slowly vertically withdrawing said seed from said first melt along and in contact with one side of a vertical guide means to cool and grow on said seed along said guide means a first monocrystalline layer comprised of an uncooled zone located near said first melt and a cooled zone located spaced from said first melt and formed upon cooling;
    C. successively supplying a second melt in a second crucible from a prescribed point to the cooled zone of said first monocrystalline layer as successively grown, said supplying of said second melt comprising the steps of:
        a. disposing in said second melt a liquid column forming member comprising said guide means having an upper end, a frame unit havng a projected portion extending beyond the upper end of said guide means and a first space between the other side of said guide means and said frame unit, said first space being capillary and extending from within said second melt up to the upper end of said guide means;
        b. permitting said second melt to rise through said first space up to the upper end of said guide means to form a liquid column of said second melt within said first space;
        c. withdrawing said first monocrystalline layer along said one side of said guide means beyond the upper end of said guide means thereby forming a second capillary space between the projected portion of said frame unit and the cooled zone of said first monocrystalline layer; and d. permitting said liquid column of said second melt to rise through said second space so that said second melt contacts said cooled zone of said first monocrystalline layer; and D. permitting a second monocrystalline layer to be grown on the cooled zone of said first monocrystalline layer by solidification of a portion of said second melt contacted with the cooled zone of said first monocrystalline layer.

2. A method according to claim 1 herein said contacting (A) of said seed with said first melt comprises disposing in said first crucible a second liquid column forming member comprising said guide means, a second frame unit having an upper end and a third space between said guide means and said frame unit, said third space extending from within said first melt; permitting said first melt to rise through said third space up to the upper end of said second frame unit to form a liquid column of said first melt within said third space; and contacting said seed with the upper surface of said liquid column of said first melt.

3. A method according to claim 2, wherein said third space is a capillary space.

4. A method according to claim 3, wherein said permitting (C) (b) of said second melt is effected by the capillary action of said second space with the aid of the introduction of an inert gas into said second crucible to press the surface of said second melt thereby permitting said second melt to rise through said second space.

5. A method according to claim 3 wherein said first melt comprises lithium carbonate and tantalum pentoxide in a molar ratio of 1:1, and said second melt comprises lithium carbonate and niobium pentoxide in a molar ratio of 1:1.

6. A method according to claim 3, wherein said first melt comprises α-alumina, and said second melt comprises silicon.

7. A method according to claim 6, wherein said second melt of silicon further contains an n type or p type impurity.

8. A method according to claim 7, comprising contacting with the uncooled zone of said second monocrystalline layer an n type impurity or a p type impurity, or a mixture of an n type impurity and p type impurity of different coefficients immediately after the formation of said uncooled zone of said second monocrystalline layer.

9. A method of growing multiple monocrystalline layers from melts, comprising:
A. contacting a seed with a first melt simultaneously at at least two points in a first crucible;
B. slowly vertically withdrawing said seed from said first melt along the outer sides of first and second vertical guide means to cool and grow on said seed along both said guide means at least two first monocrystalline layers each comprised of an uncooled zone located near said first melt and cooled zone located spaced from said first melt and formed upon said cooling;
C. successively supplying a second melt in a second crucible from a prescribed point to the cooled zone of each said first monocrystalline layer as successively grown, said supply of said second melt comprising:
   a. disposing in said second melt a liquid column forming member comprising said first and second guide means, the upper ends of which are flush with each other, and a first capillary space between the inner sides of said first and second guide means, said first space extending from within said second melt up to the upper ends of said first and second guide means;
   b. permitting said second melt to rise through said first space up to the upper ends of said guide means to form a liquid column of said second melt within said first space;
   c. withdrawing said first monocrystalline layers along the outer sides of said first and second guide means beyond said upper ends of said first and second guide means thereby forming a second capillary space between said cooled zones of said first monocrystalline layers; and
   d. permitting said liquid column of said second melt to rise through said second space so that said second melt simultaneously contacts said cooled zones of said first monocrystalline layers; and
D. permitting a second monocrystalline layer to be grown on between said cooled zones of said first monocrystalline layers by solidification of a portion of said second melt simultaneously contacted with said cooled zones of said first monocrystalline layers.

10. A method according to claim 9, wherein said contacting (A) of said seed with said first melt comprises disposing in said first crucible at least two liquid column forming members one of which comprises said first guide means, a frame unit having an upper end and a third space between said guide means and said frame unit, the other of which comprises said second guide means, a frame unit having an upper end and a fourth space between said guide means and said frame unit, said third and fourth spaces each extending from within said first melt; permitting said first melt to rise through said third and fourth spaces up to each upper end of said frame units to form liquid columns of said first melt within each of said third and fourth spaces; and contacting said seed with the upper surface of each said liquid column of said first melt.

11. A method according to claim 10, wherein said third and fourth spaces are each capillary spaces.

12. A method according to claim 11, wherein said first melt comprises lithium carbonate and tantalum pentoxide in a molar ratio of 1:1, and said second melt comprises lithium carbonate and niobium pentoxide in a molar ratio of 1:1.

* * * * *